US009520203B2

(12) United States Patent
Lee et al.

(10) Patent No.: US 9,520,203 B2
(45) Date of Patent: Dec. 13, 2016

(54) SEMICONDUCTOR MEMORY DEVICE FOR PERFORMING BOTH OF STATIC TEST AND DYNAMIC TEST DURING WAFER BURN-IN TEST AND METHOD FOR OPERATING THE SAME

(71) Applicant: SK hynix Inc., Gyeonggi-do (KR)

(72) Inventors: Sung-Yub Lee, Gyeonggi-do (KR); Geun-Il Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 75 days.

(21) Appl. No.: 14/546,720

(22) Filed: Nov. 18, 2014

(65) Prior Publication Data

US 2015/0332786 A1    Nov. 19, 2015

(30) Foreign Application Priority Data

May 19, 2014  (KR) .......................... 10-2014-0059703

(51) Int. Cl.
| | |
|---|---|
| *G11C 29/00* | (2006.01) |
| *G11C 29/06* | (2006.01) |
| *G11C 7/10* | (2006.01) |
| *G11C 7/22* | (2006.01) |
| *G11C 29/12* | (2006.01) |
| *G11C 29/26* | (2006.01) |

(52) U.S. Cl.
CPC ............. *G11C 29/06* (2013.01); *G11C 7/1078* (2013.01); *G11C 7/222* (2013.01); *G11C 29/00* (2013.01); *G11C 2029/1202* (2013.01); *G11C 2029/2602* (2013.01)

(58) Field of Classification Search
CPC ........ G11C 29/06; G11C 7/1078; G11C 7/222; G11C 29/00
See application file for complete search history.

(56) References Cited

U.S. PATENT DOCUMENTS

| | | | | |
|---|---|---|---|---|
| 6,301,190 | B1* | 10/2001 | Tsujino ................. | G11C 29/48 365/233.12 |
| 6,519,194 | B2* | 2/2003 | Tsujino ................. | G11C 29/48 365/201 |
| 7,193,917 | B2* | 3/2007 | Takahashi ............. | G11C 8/18 365/201 |
| 7,724,574 | B2* | 5/2010 | Kim ...................... | G11C 29/26 365/185.11 |
| 8,638,626 | B2* | 1/2014 | Yang .................... | G11C 29/20 365/201 |
| 2006/0023544 | A1* | 2/2006 | Yamada ................ | G11C 29/46 365/222 |

FOREIGN PATENT DOCUMENTS

| | | |
|---|---|---|
| KR | 1020100007527 | 1/2010 |
| KR | 1020130072425 | 7/2013 |

* cited by examiner

*Primary Examiner* — Esaw Abraham
(74) *Attorney, Agent, or Firm* — I P & T Group LLP

(57) ABSTRACT

A semiconductor memory device includes a first address input block which receives first information applied from an exterior as a corresponding normal address in a normal mode and receives the first information as a test clock in a test mode, a second address input block which receives second information applied from an exterior as the corresponding normal address in the normal mode and receives the second information as a test code in the test mode, and a test signal generation block which synchronizes the test code with the test clock in the test mode and generates a test command, a test address and a test data in response to a synchronized test code.

20 Claims, 3 Drawing Sheets

SEMICONDUCTOR MEMORY DEVICE FOR PERFORMING BOTH OF STATIC TEST AND DYNAMIC TEST DURING WAFER BURN-IN TEST AND METHOD FOR OPERATING THE SAME

CROSS-REFERENCE TO RELATED APPLICATIONS

The present application claims priority of Korean Patent. Application No. 10-2014-0059703 filed on May 19, 2014, which is incorporated herein by reference in its entirety.

BACKGROUND

1. Field

Exemplary embodiments of the present invention relate to a semiconductor design technology, and more particularly, to a semiconductor memory device that may perform both of a static test and a dynamic test during a wafer burn-in test, and a method for testing the semiconductor memory device.

2. Description of the Related Art

A burn-in test for semiconductor devices is performed to improve the reliability of semiconductor products including the same by effectively removing defective products before the products are released into the market.

In general, the burn-in test is divided into a wafer burn-in test that is performed in a wafer level of a semiconductor device and a package burn-in test that is performed in a package level of a semiconductor device.

The burn-in test for semiconductor memory devices is divided into a static test and a dynamic test depending on which types of stress and how the stress is applied to a memory cell array in the semiconductor memory devices.

The static test is performed by directly applying the stress to the memory cell array of the semiconductor memory device. The dynamic test is performed by applying the stress to each word line that is selected in the semiconductor memory device.

Since word lines may not be selected in a general wafer burn-in test, the static test where a plurality of word lines are simultaneously enabled and tested has been used in the wafer burn-in test. In other words, the general wafer burn-in test may not include the dynamic test where each of the word lines is individually selected and tested.

Also, since the general wafer burn-in test utilizing the static test, directly applies burn-in stress to a memory cell array, t is difficult to apply the burn-in stress to peripheral circuits, e.g., a row address path, a column address path, a data in/out path, etc., other than the memory cell array, to test the peripheral circuits.

Therefore, it would be beneficial to develop a burn-in test method that may perform the same test as included in the package burn-in test in the wafer burn-in test as well as check the burn-in test results.

SUMMARY

Exemplary embodiments of the present invention are directed to a semiconductor memory device that may perform both a static test and a dynamic test during a wafer burn-in test operation, and a method for testing the semiconductor memory device.

In accordance with an embodiment of the present invention, a semiconductor memory device includes a first address input block suitable for receiving first information applied from an exterior as a corresponding normal address in a normal mode and receiving the first information as a test clock in a test mode, a second address input block suitable for receiving second information applied from the exterior as the corresponding normal address in the normal mode and receiving the second information as a test code in the test mode, and a test signal generation block suitable for synchronizing the test code with the test clock in the test mode and generating a test command, a test address and a test data in response to a synchronized test code. The semiconductor memory device further includes: an internal circuit suitable for performing a predetermined test operation in response to the test command the test address and the test data in the test mode. Wherein the test signal generation block includes: a synchronization unit suitable for synchronizing the test code with the test clock to generate the synchronized test code in the test mode; and a decoding unit suitable for decoding the synchronized test code to generate the test command, the test address and the test data. Wherein the second address input block receives N bit information inputted simultaneously through N address pads as one corresponding normal address in the normal mode, and receives 2N bit information inputted twice in a row through the N address pads as one test code in the test mode, wherein the N is a natural number. Wherein the synchronization unit synchronizes a first N-bit test code, which is inputted first among the one test code, in parallel with a first edge of the test clock to output an upper test code, and synchronizes a second N-bit test code, which is inputted second among the one test code, in parallel with a second edge of the test clock to output a lower test code. Wherein the decoding unit decodes the upper test code to generate the test address and the test data, and decodes the lower test code to generate the test command and the test data. Wherein the first address input block receives one bit information inputted through one address pad as one corresponding normal address in the normal mode, and receives one bit information inputted toggling at a predetermined period through the address pad as the test clock in the test mode. Wherein the decoding unit enters a test operation section in response to a first predetermined value of the synchronized test code in the test mode, and exits from the test operation section in response to a second predetermined value of the synchronized test code in the test mode, wherein the decoding unit decodes the synchronized test code and generates the test command, the test address and the test data in the test operation section. Wherein an operation of the test mode is a wafer burn-in test operation. Wherein the operation of the test mode is distinguished from an operation of the normal mode based on a signal which is applied based on a setting of a Mode Register Set (MRS) or applied through a predetermined pad.

In accordance with another embodiment of the present invention, a method for operating the semiconductor memory device includes receiving first information, applied from an exterior through a plurality of address pads, as a corresponding normal address in a normal mode, receiving second information, applied from the exterior through a predetermined address pad among the address pads, as a test clock and receiving third information, applied from the exterior through the other address pads, as a test code, and synchronizing the test code with the test clock and generating a test command, a test address and a test data in response to a synchronized test code. The method for operating the semiconductor memory device further includes: performing a predetermined test operation in an internal circuit in response to the test command, the test address and the test data. Wherein the synchronizing of the test code with the test clock and the generating of the test command, the test address and the test data in response to the synchronized test code includes: synchronizing the test code with the test clock to generate the synchronized test code; and decoding the synchronized test code and generating the test command, the test address and the test data Wherein the receiving of the second information and the receiving of the third information includes: receiving one bit information inputted toggling at a predetermined period through the predetermined address pad as the test clock; and receiving 2N bit information inputted twice in a row through the other address pads as one test code, wherein the N is a natural number. Wherein the synchronizing of the test code with the test clock includes: synchronizing a first N-bit test code, which is inputted first among the one test code, with a first edge of the test clock in parallel and outputting an upper test code; and synchronizing a second N-bit test code, which is inputted second among the one test code, with a second edge of the test clock in parallel and outputting a lower test code. Wherein the decoding of the synchronized test code and the generating of the test command, the test address and the test data includes: decoding the upper test code and generating the test address and the test data; and decoding the lower test code and generating the test command and the test data. Wherein N+1 bit information is inputted simultaneously through the address pads as one corresponding normal address in the receiving of the first information. Wherein the decoding of the synchronized test code and the generating of the test command, the test address and the test data includes: entering a test operation section in response to a first predetermined value of the synchronized test code; exiting from the test operation section in response to a second predetermined value of the synchronized test code; and decoding the synchronized test code and generating the test command, the test address and the test data while entering the test operation section. Wherein an operation of the test mode is a wafer burn-in test operation. Wherein the operation of the test mode is distinguished from an operation of the normal mode in response to a signal which is applied based on a setting of a Mode Register Set (MRS) or is applied through a predetermined pad.

DETAILED DESCRIPTION

Figure 1:
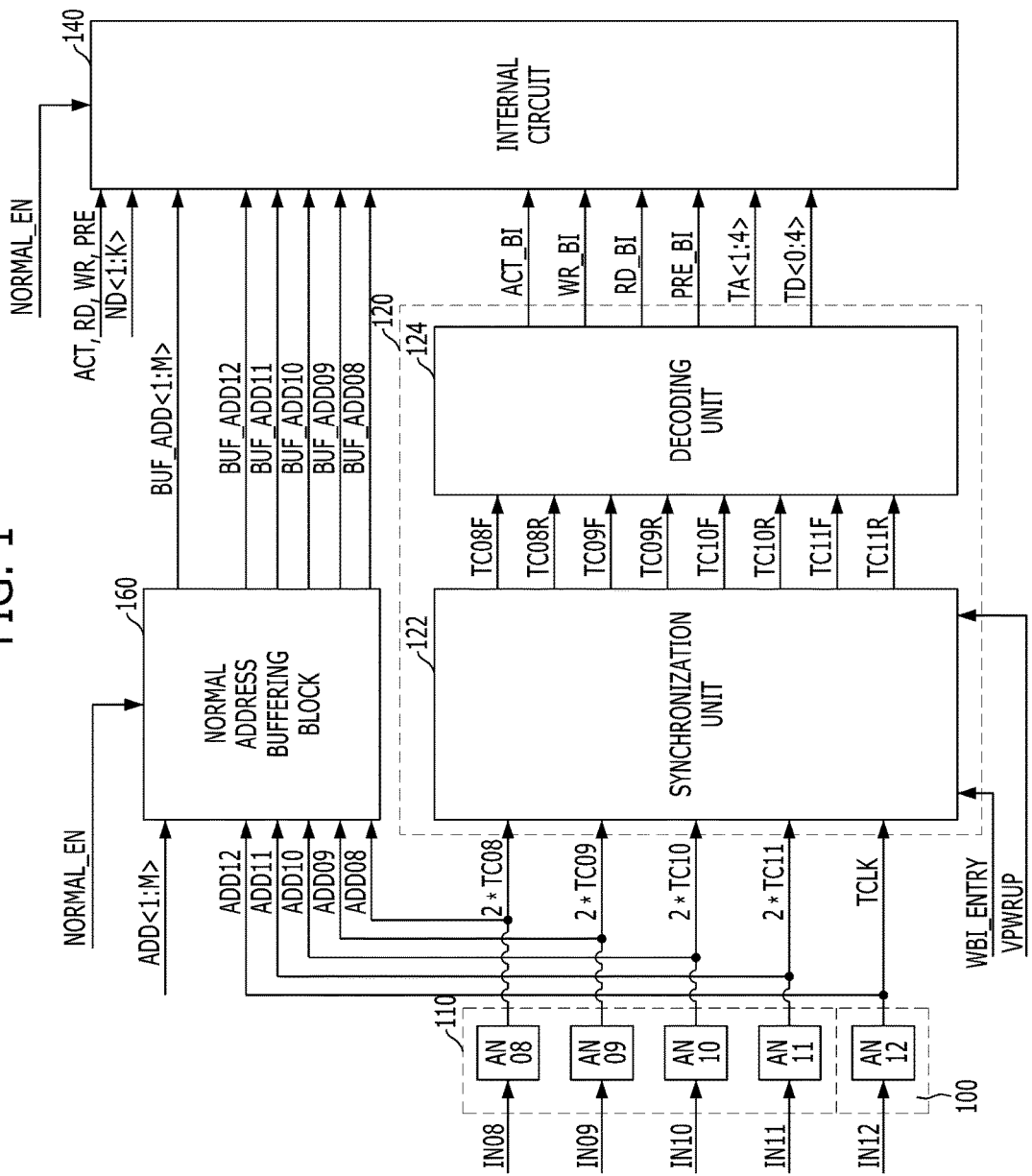
FIG. 1 is a block diagram illustrating a test operation circuit of a semiconductor memory device in accordance with an embodiment of the present invention.

Exemplary embodiments of the present invention are described below in more detail with reference to the accompanying drawings. These embodiments are provided so that this disclosure is thorough and complete, and fully conveys the scope of the present invention to those skilled in the art. All "embodiments" referred to in this disclosure refer to embodiments of the inventive concept disclosed herein. The embodiments presented are merely examples and are not intended to limit the inventive concept. Throughout the disclosure, like reference numerals refer to like parts throughout the various figures and embodiments of the present invention.

In the drawings, a thicknesses and lengths of components are exaggerated for convenience of illustration. In the following description, a detailed explanation of known related functions and constitutions may be omitted to avoid unnecessarily obscuring the subject manner of the present invention. Furthermore, 'connected/coupled' represents that one component is directly coupled to another component or indirectly coupled through another component. In this specification, a singular form may include a plural form, and vice versa, as long as it is not specifically mentioned. Furthermore, 'include/comprise' or 'including/comprising' used in the specification represents that one or more components, steps, operations, and elements exist or are added.

FIG. 1 is a block diagram illustrating a test operation circuit of a semiconductor memory device in accordance with an embodiment of the present invention.

Referring to FIG. 1, the test operation circuit includes a first address input block 100, a second address input block 110 and a test signal generation block 120. Also, the test operation circuit further includes an internal circuit 140 and a normal address buffering block 160. The test signal generation block 120 includes a synchronization unit 122 and a decoding unit 124.

The first address input block 100 receives information IN12 applied from an exterior as a corresponding normal address ADD12 in a normal mode and receives the information IN12 as a test clock TCLK in a test mode.

To be specific, the first address input block 100 includes one address pad AN12. Therefore, the first address input block 100 receives the one bit information IN12, which is inputted through the in address pad AN12 in the normal mode, as one bit ADD12 of the normal address. The first address input block 100 receives the one bit information IN12, which is inputted toggling at a predetermined period through the address pad AN12 in the test mode, as the test clock TCLK.

The second address input block 110 receives information IN08, IN09, IN10 and IN11 applied from the exterior as the bits ADD08, ACD09, ADD10 and ADD11 of a corresponding normal address in the normal mode and as one test code 2*TC08, 2*TC09, 2*TC10 and 2*TC11 in the test mode.

To be specific, the second address input block 110 includes four address pads AN08, AN09, AN10 and AN11. Therefore, the second address input block 110 receives the 4 bit information IN08 IN09, IN10 and IN11, which is inputted simultaneously through the address pads AN08, AN09, AN10 and AN11 in the normal mode, as 4 bits ADD08, ADD09, ADD10 and ADD11 of the corresponding normal address. The second address input block 110 receives 8 bit information IN08, IN09, IN10 and IN11/IN08, IN09, IN10 and IN11, which is inputted two times in a row by 4 bits through the address pads AN08, AN09, AN10 and AN11 in the test mode, as a test code 2*TC08, 2*TC09, 2*TC10 and 2*TC11.

The one bit ADD12 of the normal address inputted through the first address input block 100 and the 4 bits ADD08, ADD09, ADD10 and ADD11 of the normal address inputted through the second address input block 110 in the normal mode may be combined with each other to be included in one corresponding address. In other words, the one bit ADD12 of the normal address and the 4 bits ADD08, ADD09, ADD10 and ADD11 of the normal address may be combined with the other M bits ADD<1:M> of the normal address inputted through M address pads, which are not illustrated in the drawing because they are not included in the first and second address input blocks 100 and 110, to become one corresponding address.

Therefore, the normal address buffering block 160 buffers one corresponding address ADD<1:M>, ADD08, ADD09, ADD10, ADD11 and ADD12 where the 5 bits ADD08, ADD09, ADD10, ADD11 and ADD12 inputted through the first and second address input blocks 100 and 110 and the other M bits ADD<1:M> inputted through the M address pads, which are not illustrated in the drawing, are combined, and generates one buffered corresponding address BUF_ADD<1:M>, BUF_ADD08, BUF_ADD09, BUF_ADD10, BUF_ADD11 and BUF_ADD12. The buffered address BUF_ADD<1:M>, BUF_ADD08, BUF_ADD09, BUF_ADD10, BUF_ADD11 and BUF_ADD12 is inputted to the internal circuit 140 and used in an operation of the normal mode.

The test signal generation block 120 synchronizes the test code 2*TC08, 2*TC09, 2*TC10 and 2*TC11 with the test clock TCLK in the test mode and generates test commands ACT_BI, WR_BI, RD_BI and PRE_BI, test addresses TA<1:4> and test data TD<0:4> in response to a synchronized test code TC08F, TC09F, TC10F, TC11F, TC08R, TC09R, TC10R and TC11R.

The synchronization unit 122 synchronizes the test code 2*TC08, 2*TC09, 2*TC10 and 2*TC11 inputted through the second address input block 110 with the test clock TCLK in the test mode.

To be specific, the synchronization unit 122 synchronizes the 4-bit test code TC08, TC09, TC10 and TC11 inputted first through the address pads AN08, AN08, AN10 and AN11 with a first edge of the test clock TCLK and outputs the upper test code TC08F, TC09F, TC10F and TC11F in the test mode. The synchronization unit 122 synchronizes the 4-bit test code TC08, TC09, TC10 and TC11 inputted second through the address pads AN08 AN09, AN10 and AN11 with a second edge of the test clock TCLK and outputs the lower test code TC08R, TC09R, TC10R and TC11R in the test mode.

For example, the first edge of the test clock TCLK may be a falling edge of the test clock TCLK, and the second edge of the test clock TCLK may be a rising edge of the test clock TCLK. Conversely, the first edge of the test clock TCLK may be the rising edge of the test clock TCLK, and the second edge of the test clock TCLK may be the falling edge of the test clock TCLK.

The decoding unit 124 decodes the test code TC08F, TC09F, TC10F, TC11F, TC08R, TC09R, TC10R and TC11R outputted from the synchronization unit 122 and generates the test commands ACT_BI, WR_BI, RD_BI and PRE_BI the test addresses TA<1:4> and the test data TD<0:4>.

To be specific, the decoding unit 124 decodes the upper test code TC08F, TC09F, TC10F and TC11F and generates the test addresses TA<1:4> and test data TD<0:4>. The decoding unit 124 decodes the lower test code TC08R, TC09R, TC10R and TC11R and generates the test commands ACT_BI, WR_BI, RD_BI and PRE_BI and the test data TD<0:4>.

The test data TD<0:4> are generated based on not only the result obtained by decoding the upper test code TC08F, TC09F, TC10F and TC11F but also the result obtained by decoding the lower test code TC08R, TC09R, TC10R and TC11R. This is because a portion TC11R of the lower test code TC08R, TC09R, TC10R and TC11R is used to generate the test data TD<0:4>. The lower test code may not be used or may be used more than the one code TC11R to generate the test data TD<0:4> depending on the design of the semiconductor memory device.

The decoding unit 124 enters a test operation section when the output test code TC08F, TC09F, TC10F, TC11F, TC08R, TC09R, TC10R and TC11R of the synchronization unit 122 has a first predetermined value and exits from the test operation section when the output test code TC08F, TC09F, TC10F, TC11F, TC08R, TC09R, TC10R and TC11R of the synchronization unit 122 has a second predetermined value in the test mode. The decoding unit 124 decodes the output test code TC08F, TC09F, TC10F, TC11F, TC08R, TC09R, TC10R and TC11R of the synchronization unit 122 and generates the test commands ACT_BI, WR_BI, RD_BI and PRE_BI, the test addresses TA<1:4> and the test data TD<0:4> just while entering the test operation section. In other words, the decoding unit 124 does not perform a decoding operation and generates the test commands ACT_BI, WR_BI, RD_BI and PRE_BI, the test addresses TA<1:4> and the test data TD<0:4> regardless of what value the output test code TC08F, TC09F, TC10F, TC11F, TC08R, TC09R, TC10R and TC11R of the synchronization unit 122 has, while exiting from the test operation section.

A signal TVBISS_EN indicating whether the decoding unit 124 enters the test operation section or exits from the test operation section is included in the test data TD<0:4> outputted from the decoding unit 124. In other words, after entering the test mode, the decoding operation is enabled as the decoding unit 124 enables the signal TVBISS_EN when the test code TC08F, TC09F, TC10F, TC11F, TC08R, TC09R, TC10R and TC11R outputted through the synchronization unit 122 has the first predetermined value, and the decoding operation is disabled as the decoding unit 124 disables the signal TVBISS_EN when the test code TC08F, TC09F, TC10F, TC11F, TC08R, TC09R, TC10R and TC11R has the second predetermined value.

Therefore, after the operation of the test mode begins and the synchronized test code TC08F, TC09F, TC10F, TC11F, TC08R, TC09R, TC10R and TC11R has the value of enabling the signal TVBISS_EN, the decoding unit 124 normally performs the decoding operation in response to the subsequent value of the synchronized test code TC08F, TC09F, TC10F, TC11F, TC08R, TC09R, TC10R and TC11R. The decoding unit 124 does not normally perform the decoding operation after the synchronized test code TC08F, TC09F, TC10F, TC11F, TC08R, TC09R, TC10R and TC11R has the value of disabling the signal TVBISS_EN.

The internal circuit 140 performs a test operation which is predetermined based on the test commands ACT_BI, WR_BI, RD_BI and PRE_BI the test addresses TA<1:4> and the test data TD<0:4> in the test mode. The predetermined test operation may include active and precharge operations of individually selecting a plurality of word lines included in a memory cell array and read and write operations of inputting/outputting data of a selected word line.

Also, the internal circuit 140 performs a normal operation which is predetermined based on a normal command ACT, RD, WR or PRE, the corresponding normal address BUF_ADD<1:M>, BUF_ADD08, BUF_ADD09, BUF_ADD10, BUF_ADD11 and BUF_ADD12 and normal data ND<1:K> in a normal mode. The predetermined normal operation may include a data input/output operation that may be performed in a general semiconductor memory device. Therefore, although not illustrated in the drawing, the normal command ACT, RD, WR or PRE may be generated through a command input pad and a command decoder of the general semiconductor memory device.

The operation of the test mode in the aforementioned structure may include the wafer burn-in and package burn-in test operations. As described in the prior art, the most effective operation may be the wafer burn-in test operation.

In other words, all the test operations of the semiconductor memory device may be controlled through some address pads predetermined during the wafer burn-in test operation.

The test mode indicates a section where signals WBI_ENTRY and VPWRUP are enabled, and the normal mode indicates a section where a signal NORMAL_EN is enabled. The signals WBI_ENTRY, VPWRUP and NORMAL_EN are generated inside the semiconductor memory device in response to a Mode Register Set (MRS) or a signal (not shown) applied through a predetermined pad.

Figure 2:
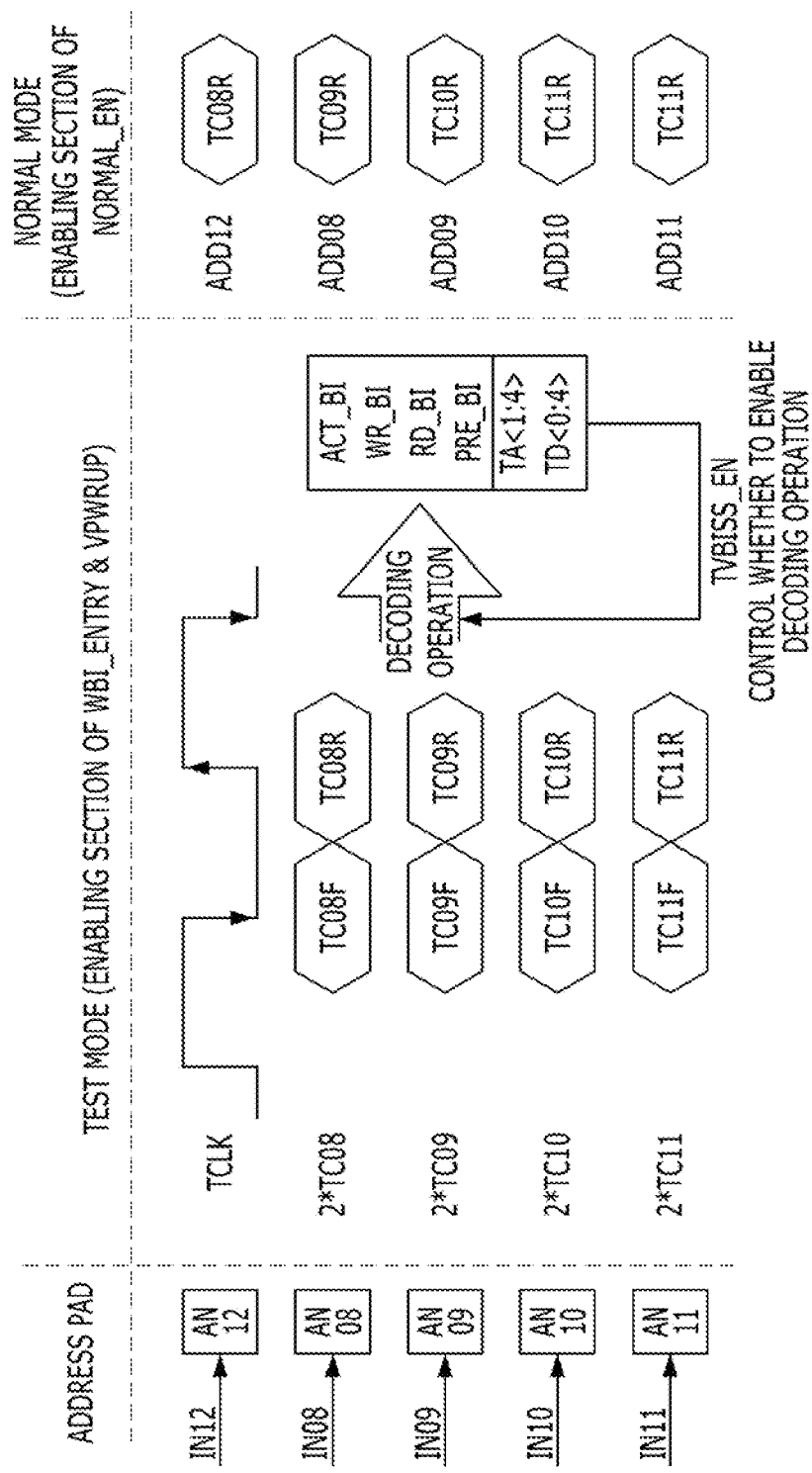
FIG. 2 is a timing diagram illustrating an operation of the test operation circuit of the semiconductor memory device shown in FIG. 1.

FIG. 2 is a timing diagram illustrating an operation of the test operation circuit of the semiconductor memory device shown in FIG. 1.

Referring to FIG. 2, the signals inputted to the test operation circuit through the address pads AN08, AN09, AN10, AN11 and AN12 are changed based on operation modes.

In the normal mode, the bit information IN08, IN09, IN10, IN11 and IN12 applied from the exterior through the address pads AN08, AN09, AN10, AN11 and AN12 is inputted as a corresponding normal address ADD08, ADD09, ADD10, ADD11 and ADD12. The inputted normal address ADD08, ADD09, ADD10, ADD11 and ADD12 is buffered by the normal address buffering block 160 and applied to the internal circuit 140 to be used in the operation of the normal mode.

To be specific, as illustrated in the drawing, the 5 bit information IN08, IN09 IN10, IN11 and IN12 is inputted through the address pads AN08, AN09, AN10, AN11 and AN12 as the normal address ADD08 ADD09, ADD10, ADD11 and ADD12 in the normal mode. The normal address ADD08 ADD09, ADD10, ADD11 and ADD12 corresponding to the 5 bit information IN08, IN09, IN10, IN11 and IN12 inputted through the address pads AN08, AN09, AN10, AN11 and AN12 is combined with the other M bits ADD<1:M> of the normal address inputted through the M address pads which are not illustrated in the drawing, and they become one corresponding normal address ADD<1:M> ADD08, ADD09, ADD10, ADD11 and ADD12. The normal address ADD<1:M>, ADD08, ADD09, ADD10, ADD11 and ADD12 is buffered by the normal address buffering block 160, and the buffered normal address BUF_ADD<1:M, BUF_ADD08, BUF_ADD09, BUF_ADD10, BUF_ADD11 and BUF_ADD12 is applied to the internal circuit 140 to be used in the operation of the normal mode.

In the test mode, the one bit information IN12 applied from the exterior is inputted as the test clock TCLK through one predetermined address pad AN12 among the address pads AN08, AN09, AN10, AN11 and AN12, and the information IN08, IN09, IN10 and IN11 applied from the exterior is inputted as the test code 2*TC08, 2*TC09, 2*TC10 and 2*TC11 through the other address pads AN08, AN09, AN10 and AN11.

To be specific, the one bit information IN12 toggling at a predetermined period is inputted as the test dock TCLK through the predetermined address pad AN12 in the test mode. When the 4 bit information IN08, IN09, IN10 and IN11 is inputted two times in a row through the other address pads AN08, AN09, AN10 and AN11 and becomes the 8 bit information IN08, IN09 IN10 and IN11/IN08, IN09, IN10 and IN11, the 8 bit information IN08, IN09, IN10 and IN11/IN08, IN09, IN10 and IN11 is inputted as a test code 2*TC08, 2*TC09 2*TC10 and 2*TC11.

The inputted test code 2*TC08, 2*TC09, 2*TC10 and 2*TC11 is synchronized with the test clock TCLK, and the test commands ACT_BI, WR_BI, RD_BI and PRE_BI, the test addresses TA<1:4> and the test data TD<0:4> are generated in response to the synchronized test code TC08F, TC09F, TC10F, TC11F, TC08R, TC09R, TC10R and TC11R.

To be specific, the operation of synchronizing the inputted test code 2*TC08, 2*TC09, 2*TC10 and 2*TC11 with the test clock TCLK is performed in advance. Subsequently, the synchronized test code TC08F, TC09F, TC10F, TC11F, TC08R, TC09R, TC10R and TC11R is decoded, and the operation of generating the test commands ACT_BI, WR_BI, RD_BI and PRE_BI, the test addresses TA<1:4> and the test data TD<0:4> is performed.

In the synchronizing operation, the N-bit test code TC08, TC09, TC10 and TC11 inputted earlier among the inputted test code 2*TC08, 2*TC09, 2*TC10 and 2*TC11 is synchronized in parallel with the falling edge of the test clock TCLK and outputted as the upper test code TC08F, TC09F, TC10F and TC11F. Subsequently, the N-bit test code TC08, TC09, TC10 and TC11 inputted later among the test code 2*TC08, 2*TC09, 2*TC10 and 2*TC11 is synchronized in parallel with the rising edge of the test clock TCLK and outputted as the lower test code TC08R, TC09R, TC10R and TC11R.

In the decoding operation, the test addresses TA<1:4> and the test data TD<0:4> are generated by decoding the upper test code TC08F, TC09F, TC10F and TC11F. The test commands ACT_BI, WR_BI, RD_BI and PRE_BI and the test data TD<0:4> are generated by decoding the lower test code TC08R, TC09R, TC10R and TC11R.

The test data TD<0:4> are generated based on not only the result obtained by decoding the upper test code TC08F, TC09F, TC10F and TC11F but also the result obtained by decoding the lower test code TC08R, TC09R, TC10R and TC11R. This is because a portion TC11R of the lower test code TC08R, TC09R, TC10R and TC11R is used to generate the test data TD<0:4>. The lower test code may or may not be used more than the one code TC11R to generate the test data TD<0:4> depending on the design of the semiconductor memory device.

Meanwhile, the decoding operation is enabled when the synchronized test code TC08F, TC09F, TC10F, TC11F, TC08R, TC09R, TC10R and TC11R has the first predetermined value and disabled when the synchronized test code TC08F, TC09F, TC10F, TC11F, TC08R, TC09R, TC10R and TC11R has the second predetermined value. Only when the decoding operation is enabled is the synchronized test code TC08F, TC09F, TC10F, TC11F, TC08R, TC09R, TC10R and TC11R normally decoded, and the test commands ACT_BI, WR_BI, RD_BI and PRE_BI, the test addresses TA<1:4> and the test data TD<0:4> are generated. In contrast, when the decoding operation is disabled, the test commands ACT_BI, WR_BI, RD_BI and PRE_BI, the test addresses TA<1:4> and the test data TD<0:4> are not generated since the decoding operation is not performed regardless of what value the synchronized test code TC08F, TC09F, TC10F, TC11F, TC08R, TC09R, TC10R and TC11R has.

A signal TVBISS_EN indicating whether the decoding operation is enabled or disabled is included in the test data TD<0:4> outputted from the decoding operation. In other words, after entering the test mode, the decoding operation is enabled as the signal TVBISS_EN enabled when the synchronized test code TC08F, TC09F, TC10F, TC11F, TC08R, TC09R, TC10R and TC11R has the first predetermined value and the decoding operation is disabled as the signal TVBISS_EN is disabled when the synchronized test code TC08F, TC09F, TC10F, TC11F, TC08R, TC09R, TC10R and TC11R has the second predetermined value.

Therefore, after the operation of the test mode starts to be performed and the synchronized test code TC08F, TC09F, TC10F, TC11F, TC08R, TC09R, TC10R and TC11R has the value of enabling the signal TVBISS_EN, the decoding operation is normally performed in response to the subsequent value of the synchronized test code TC08F, TC09F, TC10F, TC11F, TC08R, TC09R, TC10R and TC11R. The decoding operation is not normally performed after the synchronized test code TC08F, TC09F, TC10F, TC11F, TC08R, TC09R, TC10R and TC11R has the value of disabling the signal TVBISS_EN.

The test commands ACT_BI, WR_BI, RD_BI and PRE_BI, the test addresses TA<1:4> and the test data TD<0:4> are applied to the internal circuit 140 so that the predetermined test operation is performed on the internal circuit 140.

The operation of the test mode which is described above may include the wafer burn-in test operation and the package burn-in test operation. As described in the prior art, the most effective operation may be the wafer burn-in test operation. In other words, all the test operations of the semiconductor memory device may be controlled through address pads that are predetermined during the wafer burn-in test operation.

The test mode indicates a section where signals WBI_ENTRY and VPWRUP are enabled, and the normal mode indicates a section where a signal NORMAL_EN is enabled. The signals WBI_ENTRY, VPWRUP and NORMAL_EN are generated inside the semiconductor memory device in response to a Mode Register Set (MRS) or a signal (not shown) applied through a predetermined pad.

Figure 3:
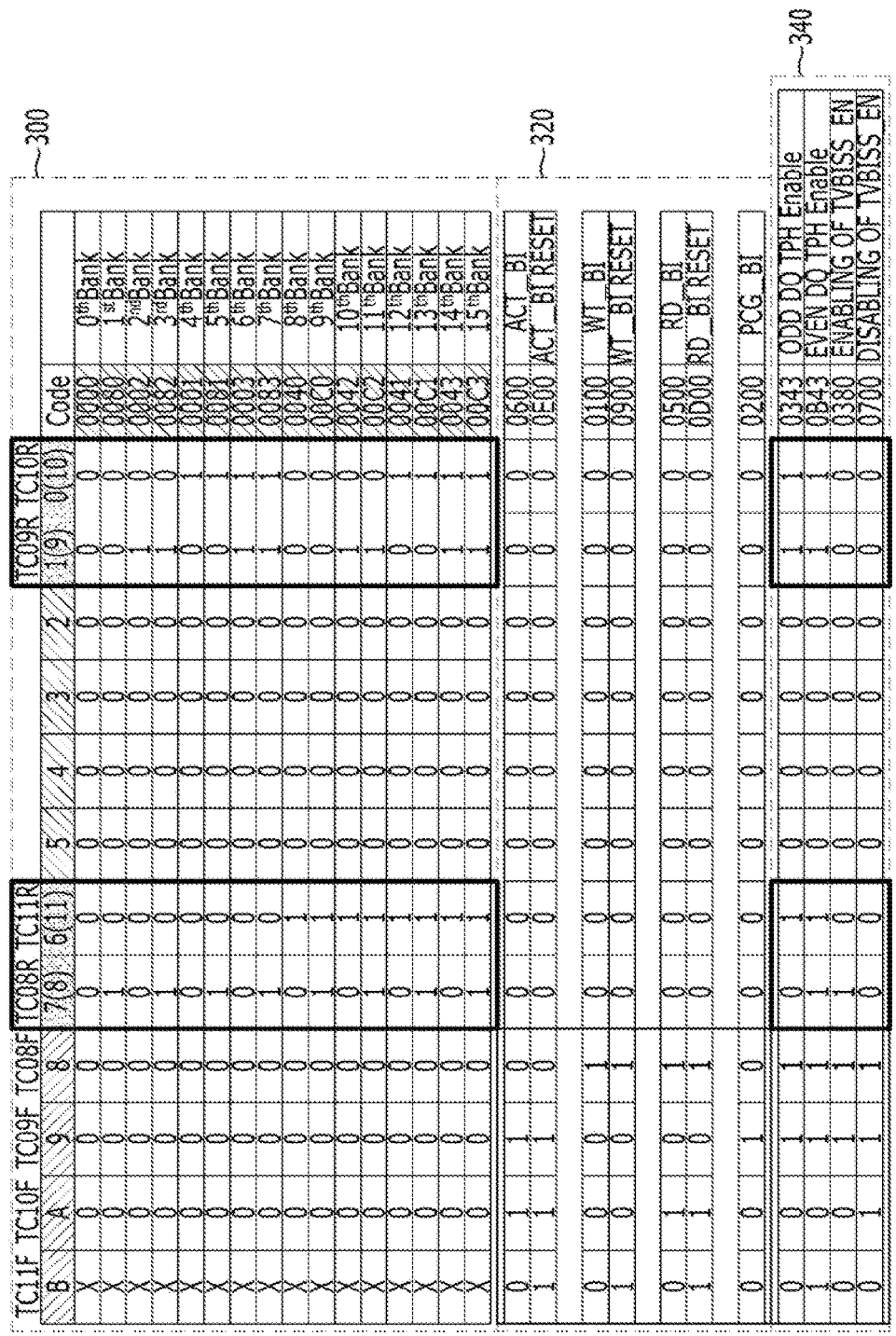
FIG. 3 is a table describing a decoding operation of the test operation circuit of the semiconductor memory device shown in FIG. 1.

FIG. 3 is a table describing the decoding operation of the test operation circuit of the semiconductor memory device shown in FIG. 1.

Referring to FIG. 3, the decoding operation of the test operation circuit is divided into a decoding operation 300 on the test address TA<1:4>, a decoding operation 320 on the test command ACT_BI, WR_BI, RD_BI and PRE_BI and a decoding operation 340 on the test data TD<0:4>.

In the decoding operation 300 on the test address TA<1:4>, the value of the test address TA<1:4> is changed based on the variation in the value of the lower test code TC08R, TC09R, TC10R and TC11R. In other words, the decoding operation 300 on the test address TA<1:4> has nothing to do with the upper test code TC08F, TC09F, TC10F and TC11F, and the upper test code TC08F, TC09F, TC10F and TC11F is represented by '0' or 'X' in the table.

For example, in the decoding operation 300 on the test address TA<1:4>, it may be seen that the test address TA<1:4> has 16 values since the lower test code TC08R, TC09R, TC10R and TC11R is formed of 4 bits. Also, the values 2, 3, 4 and 5 of the test address TA<1:4> which may not be recognized from the test address TA<1:4> are all represented by '0' since the internal circuit 140 recognizes the test address TA<1:4> in the same manner as what is used in the normal mode.

Although it is illustrated as an example in the drawing that the semiconductor memory device includes 16 banks and each of banks is selected based on the test address TA<1:4>, the inventive concept is not limited to this, and a plurality of word lines (not shown) included in the semiconductor memory device may be individually selected according to different embodiments of the present invention. In accordance with the embodiment where the word lines (not shown) included in the semiconductor memory device are individually selected, the number of bits of the test address which is inputted may increase.

In the decoding operation 320 on the test command ACT_BI, WR_BI, RD_BI and PRE_BI, the types of test commands ACT_BI, WR_BI, RD_BI and PRE_BI are changed based on the variation in the values of the upper test code TC08F, TC09F, TC10F and TC11F. In other words, the decoding operation 320 on the test command ACT_BI, WR_BI, RD_BI and PRE_BI has nothing to do with the lower test code TC08R, TC09R, TC10R and TC11R, and the lower test code TC08R, TC09R, TC10R and TC11R is represented by '0' in the table.

For example, in the decoding operation 320 on the test command ACT_BI, WR_BI, RD_BI and PRE_BI, the upper test code TC08F, TC09F, TC10F and TC11F is decoded, and the test commands ACT_BI, WR_BI, RD_BI and PRE_BI of the 7 total cases are generated. In other words, a test active command ACT_BI, a test active reset command ACT_BI RESET, a test write command WR_BI, a test write reset command WR_BI RESET, a test read command RD_BI, a test read reset command RD_BI RESET and a test precharge command PCT_BI are generated through the operation of decoding the upper test code TC08F, TC09F, TC10F and TC11F.

The types of the test commands ACT_BI, WR_BI, RD_BI and PRE_BI are determined based on the types of commands used for a general semiconductor memory device, and different types of the commands may be added since the upper test code TC08F, TC09F, TC10F and TC11F is formed of a total of 4 bits.

In the decoding operation 300 on the test address TA<1:4>, the value of the upper test code TC08F, TC09F, TC10F and TC11F is fixed as '0' or 'X'. This does not mean that the test address TA<1:4> is generated through the lower test code TC08R, TC09R, TC10R and TC11R just when the value of the upper test code TC08F, TC09F, TC10F and TC11F is '0' or 'X'. It means that the value of the test address TA<1:4> is determined based on the value of the lower test code TC08R, TC09R, TC10R and TC11R in all cases where the test commands ACT_BI, WR_BI, RD_BI and PRE_BI are inputted.

Similarly, in the decoding operation 320 on the test command ACT_BI, WR_BI, RD_BI and PRE_BI, the value of the lower test code TC08R, TC09R, TC10R and TC11R is fixed as '0'. This does not mean that the test commands ACT_BI, WR_BI, RD_BI and PRE_BI are generated through the upper test code TC08F, TC09F, TC10F and TC11F just when the value of the lower test code TC08R, TC09R, TC10R and TC11R is '0'. It means that the test commands ACT_BI, WR_BI, RD_BI and PRE_BI are determined based on the value of the upper test code TC08F, TC09F, TC10F and TC11F in all cases where the test address TA<1:4> is inputted.

In short, the decoding operation 300 on the test address TA<1:4> and the decoding operation 320 on the test command ACT_BI, WR_BI, RD_BI and PRE_BI are performed overlapping one another. For example, in order to perform a test active operation on a $0^{th}$ bank, the 8-bit information IN08, IN09, IN10 and IN11/IN08, IN09, IN10 and IN11 may be inputted so that the upper test code TC08F, TC09F, TC10F and TC11F is set to '0 1 1 0' and the lower test code TC08R, TC09R, TC10R and TC11R is set to '0 0 0 0'. Similarly, in order to perform a test write operation on a $12^{th}$ bank, the 8 bit information IN08, IN09, IN10 and IN11/IN08, IN09 IN10 and IN11 may be inputted so that the upper test code TC08F, TC09F, TC10F and TC11F is set to '1 0 0 0' and the lower test code TC08R, TC09R, TC10R and TC11R is set to '0 0 1 1'.

In the decoding operation 340 on the test data TD<0:4>, the types of the test data TD<0:4> are changed when the value of the lower test code TC08R, TC09R, TC10R and TC11R properly varies together with the value of the upper test code TC08F, TC09F, TC10F and TC11F. In other words, the values of the upper test code TC08F, TC09F, TC10F and TC11F and the lower test code TC08R, TC09R, TC10R and TC11R are all used in the decoding operation 340 on the test data TD<0:4>. Therefore, the decoding operation 340 on the test data TD<0:4> may not be performed overlapping with the decoding operation 300 on the test address TA<1:4> and the decoding operation 320 on the test command ACT_BI, WR_BI, RD_BI and PRE_BI.

Meanwhile, after a first predetermined value of the synchronized test code TC08F, TC09F, TC10F, TC11F, TC08R, TC09R, TC10R and TC11R is inputted in order to enable the signal TVBISS_EN in the test mode, the decoding operation 300 on the test address TA<1:4>, the decoding operation 320 on the test command ACT_BI, WR_BI, RD_BI and PRE_BI and the decoding operation 340 on the test data TD<0:4> may be performed in response to the subsequent value of the synchronized test code TC08F, TC09F, TC10F, TC11F, TC08R, TC09R, TC10R and TC11R. In other words, the upper test code TC08F, TC09F, TC10F and TC11F which is set to '1 1 0 0', and the lower test code TC08R, TC09R, TC10R and TC11R which is set to '1 0 0 0' are inputted in order to enable the signal TVBISS_EN during the decoding operation 340 on the test data TD<0:4> after entering the test mode. In other words, when the synchronized test code TC08F, TC09F, TC10F, TC11F, TC08R, TC09R, TC10R and TC11R is not inputted after entering the test mode, the decoding operation 300 on the test address TA<1:4>, the decoding operation 320 on the test command ACT_BI, WR_BI, RD_BI and PRE_BI and the decoding operation 340 on the test data TD<0:4> are not performed regardless of the value of the synchronized test code TC08F, TC09F, TC10F, TC11F, TC08R, TC09R, TC10R and TC11R.

Similarly, the decoding operation 320 on the test command ACT_BI, WR_BI, RD_BI and PRE_BI and the decoding operation 340 on the test data TD<0:4> may not be performed regardless of the value of the synchronized test code TC08F, TC09F, TC10F, TC11F, TC08R, TC09R, TC10R and TC11R when a second predetermined value of the synchronized test code TC08F, TC09F, TC10F, TC11F, TC08R, TC09R, TC10R and TC11R is inputted in order to disable the signal TVBISS_EN during the decoding operation 340 on the test data TD<0:4> after entering the test mode. In other words, the upper test code TC08F, TC09F, TC10F and TC11F which is set to '1 1 1 0', and the lower test code TC08R, TC09R, TC10R and TC11R which is set to '0 0 0 0' are inputted in order to disable the signal TVBISS_EN during the decoding operation 340 on the test data TD<0:4> after entering the test mode.

'ODD DQ TPH Enable' and 'EVEN DQ TPH Enable' included in the decoding operation 340 on the test data TD<0:4> indicate a general test operation that may be exemplified through the test data TD<0:4>, and a detailed description thereon is omitted herein since the test operation is widely known to those skilled in the art.

In accordance with the embodiments of the present invention, both a static test and a dynamic test may be performed during a wafer burn-in test as a test command, and a test address and a test data are generated based on a signal inputted through a predetermined address pad during the wafer burn-in test.

While the present invention has been described with respect to specific embodiments, the embodiments are not intended to be restrictive, but descriptive. Further, t is noted that the present invention may be applied in various ways through substitution, change, and modification, by those skilled in the art without departing from the scope of the present invention as defined by the following claims.

For example, although a structure having five address pads AN08, AN09, AN10, AN11 and AN12 is described in the embodiments of the present invention, the present invention may include a structure having more or less address pads.

What is claimed is:
1. A semiconductor memory device, comprising:
a first address input block that receives first information applied from an exterior;
a second address input block that receives second information applied from the exterior;
a normal address buffering block that receives and buffers the first and second information as a corresponding normal address in a normal mode; and
a test signal generation block that receives the first and second information as a test clock and a test code, respectively, in a test mode to generate a test command, a test address and a test data based on the test code and the test clock, in the test mode.
2. The semiconductor memory device of claim 1, further comprising:
an internal circuit that performs a predetermined test operation in response to the test command, the test address and the test data in the test mode.
3. The semiconductor memory device of claim 1, wherein the test signal generation block includes:
a synchronization unit that synchronizes the test code with the test clock to generate a synchronized test code in the test mode; and
a decoding unit that decodes the synchronized test code to generate the test command, the test address and the test data.
4. The semiconductor memory device of claim 3, wherein the second address input block receives N bit information inputted simultaneously through N address pads as one corresponding normal address in the normal mode, and receives 2N bit information inputted twice in a row through the N address pads as one test code in the test mode, wherein the N is a natural number.
5. The semiconductor memory device of claim 4, wherein the synchronization unit synchronizes a first N-bit test code, which is inputted first among the one test code, in parallel with a first edge of the test clock to output an upper test code, and synchronizes a second N-bit test code, which is inputted second among the one test code, in parallel with a second edge of the test clock to output a lower test code.
6. The semiconductor memory device of claim 5, wherein the decoding unit decodes the upper test code to generate the test address and the test data, and decodes the lower test code to generate the test command and the test data.
7. The semiconductor memory device of claim 1, wherein the first address input block receives one bit information inputted through one address pad as one corresponding normal address in the normal mode, and receives one bit information inputted toggling at a predetermined period through the address pad as the test clock in the test mode.

8. The semiconductor memory device of claim 3, wherein the decoding unit enters a test operation section in response to a first predetermined value of the synchronized test code in the test mode, and exits from the test operation section in response to a second predetermined value of the synchronized test code in the test mode,
wherein the decoding unit decodes the synchronized test code and generates the test command, the test address and the test data in the test operation section.

9. The semiconductor memory device of claim 1, wherein an operation of the test mode is a wafer burn-in test operation.

10. The semiconductor memory device of claim 1, wherein the operation of the test mode is distinguished from an operation of the normal mode based on a signal which is applied based on a setting of a Mode Register Set (MRS) or applied through a predetermined pad.

11. A method for operating the semiconductor memory device, comprising:
in a normal mode, receiving first information, applied from an exterior through a plurality of address pads, as a corresponding normal address;
in a test mode, receiving second information, applied from the exterior through a predetermined address pad among the plurality of address pads, as a test clock and receiving third information, applied from the exterior through the other address pads among the plurality of address pads, as a test code;
synchronizing the test code with the test clock to generate a synchronized test code; and
decoding the synchronized test code to generate a test command, a test address and a test data.

12. The method of claim 11, further comprising:
performing a predetermined test operation in an internal circuit in response to the test command, the test address and the test data.

13. The method of claim 11, wherein the synchronizing of the test code with the test clock and the generating of the test command, the test address and the test data in response to the synchronized test code includes:
synchronizing the test code with the test clock to generate the synchronized test code; and
decoding the synchronized test code and generating the test command, the test address and the test data.

14. The method of claim 13, wherein the receiving of the second information and the receiving of the third information includes:

receiving one bit information inputted toggling at a predetermined period through the predetermined address pad as the test clock; and
receiving 2N bit information inputted twice in the row through the other address pads as one test code,
wherein the N is a natural number.

15. The method of claim 14, wherein the synchronizing of the test code with the test clock includes:
synchronizing a first N-bit test code, which is inputted first among the one test code, with a first edge of the test clock in parallel and outputting an upper test code; and
synchronizing a second N-bit test code, which is inputted second among the one test code, with a second edge of the test clock in parallel and outputting a lower test code.

16. The method of claim 15, wherein the decoding of the synchronized test code and the generating of the test command, the test address and the test data includes:
decoding the upper test code and generating the test address and the test data; and
decoding the lower test code and generating the test command and the test data.

17. The method of claim 14, wherein N+1 bit information is inputted simultaneously through the address pads as one corresponding normal address in the receiving of the first information.

18. The method of claim 13, wherein the decoding of the synchronized test code and the generating of the test command, the test address and the test data includes:
entering a test operation section in response to a first predetermined value of the synchronized test code;
exiting from the test operation section in response to a second predetermined value of the synchronized test code; and
decoding the synchronized test code and generating the test command, the test address and the test data while entering the test operation section.

19. The method of claim 11, wherein an operation of the test mode is a wafer burn-in test operation.

20. The method of claim 11, wherein the operation of the test mode is distinguished from an operation of the normal mode in response to a signal which is applied based on a setting of a Mode Register Set (MRS) or is applied through a predetermined pad.

* * * * *